(12) United States Patent
Ahmad

(10) Patent No.: US 8,786,363 B2
(45) Date of Patent: Jul. 22, 2014

(54) APPARATUS AND METHODS FOR ELECTRONIC AMPLIFICATION

(75) Inventor: Fazil Ahmad, Santa Clara, CA (US)

(73) Assignee: Analog Devices, Inc., Norwood, MA (US)

( * ) Notice: Subject to any disclaimer, the term of this patent is extended or adjusted under 35 U.S.C. 154(b) by 52 days.

(21) Appl. No.: 13/495,929

(22) Filed: Jun. 13, 2012

(65) Prior Publication Data

US 2013/0335141 A1    Dec. 19, 2013

(51) Int. Cl.
    *H03F 3/45*    (2006.01)

(52) U.S. Cl.
    USPC .................................. 330/69; 330/9

(58) Field of Classification Search
    USPC ................. 330/9, 69; 327/124, 307
    See application file for complete search history.

(56) References Cited

U.S. PATENT DOCUMENTS

| | | | |
|---|---|---|---|
| 6,734,723 B2 * | 5/2004 | Huijsing et al. | 330/9 |
| 7,292,095 B2 | 11/2007 | Burt et al. | |
| 7,382,183 B2 * | 6/2008 | Nolan et al. | 330/69 |
| 7,535,295 B1 * | 5/2009 | Huijsing et al. | 330/9 |
| 7,586,368 B2 * | 9/2009 | Trifonov | 330/9 |
| 7,724,080 B2 * | 5/2010 | Luff | 330/9 |
| 7,764,118 B2 | 7/2010 | Kusuda et al. | |

OTHER PUBLICATIONS

Bilotti et al., *Chopper-Stabilized Amplifiers With a Track-and-Hold Signal Demodulator*, Allegro MicroSystems, Inc., 8 pages (Apr. 1999).
Wu et al., *A Chopper Current-Feedback Instrumentation Amplifier with a 1mHz 1/f Noise Corner and an AC-Coupled Ripple-Reduction Loop*, ISSCC 2009/Session 19/ Analog Techniques/19.1, 2009 IEEE International Solid-State Circuits Conference, 3 pages (Feb. 2009).

* cited by examiner

*Primary Examiner* — Khanh V Nguyen
(74) *Attorney, Agent, or Firm* — Knobbe, Martens, Olson & Bear, LLP

(57) ABSTRACT

Apparatus and methods for electronic amplification are provided. In one embodiment, a method of electronic amplification includes amplifying a differential input voltage signal to generate a feed-forward signal, chopping the feed-forward signal at a chopping frequency to generate a chopped feed-forward signal, notch filtering the chopped feed-forward signal at the chopping frequency to generate a notched signal, generating an input offset correction signal based at least partly on the notched signal, and amplifying the differential input voltage signal using a signal amplification block to generate an output signal. Amplifying the differential input voltage signal using the signal amplification block includes chopping the input signal at the chopping frequency to generate a chopped input signal and combining the chopped input signal and the offset correction signal to reduce input offset error of the signal amplification block.

22 Claims, 10 Drawing Sheets

APPARATUS AND METHODS FOR ELECTRONIC AMPLIFICATION

BACKGROUND

1. Field

Embodiments of the invention relate to electronic devices, and more particularly, to amplifiers.

2. Description of the Related Technology

An amplifier, such as an operational amplifier, can include chopper circuitry to help reduce the amplifier's input offset voltage. For example, in a conventional chopper-stabilized amplifier, chopper circuitry can be used to periodically swap or chop the positive and negative inputs of an input amplification stage of the amplifier and to periodically swap or chop the positive and negative outputs of the amplifier's input amplification stage at a chopping frequency. Additionally, the amplifier can use an output amplification stage to generate the amplifier's output signal by integrating the input amplification stage's chopped output signal. Although including conventional chopper circuitry in an amplifier can reduce the amplifier's input offset voltage, configuring the amplifier in this manner can also generate ripples in the amplifier's output signal at the chopping frequency and at harmonics thereof.

There is a need for amplifiers having improved performance. Additionally, there is need for chopper stabilized amplifiers having reduced input offset voltage and reduced output voltage ripple.

SUMMARY

In one embodiment, an amplifier includes a signal amplification block and a feed-forward offset correction block. The signal amplification block is configured to receive a differential input voltage signal and to amplify the differential input voltage signal to generate an output signal, and the feed-forward offset correction block is configured to receive the differential input voltage signal and to generate an input offset correction signal. The feed-forward offset correction block includes a first feed-forward amplification circuit configured to amplify the differential input voltage signal to generate a feed-forward signal, a feed-forward chopping circuit configured to chop the feed-forward signal at a chopping frequency to generate a chopped feed-forward signal, and a notch filter configured to attenuate the chopped feed-forward signal at the chopping frequency to generate a notched signal. The feed-forward offset correction block is configured to generate the input offset correction signal based at least partly on the notched signal, and the signal amplification block is further configured to receive the input offset correction signal from the feed-forward offset correction block and to reduce an input offset voltage of the amplifier using the input offset correction signal.

In another embodiment, a method of electronic amplification is provided. The method includes amplifying a differential input voltage signal to generate a feed-forward signal, chopping the feed-forward signal at a chopping frequency to generate a chopped feed-forward signal, notch filtering the chopped feed-forward signal at the chopping frequency to generate a notched signal, generating an input offset correction signal based at least partly on the notched signal, and amplifying the differential input voltage signal using a signal amplification block to generate an output signal. Amplifying the differential input voltage signal to generate the output signal includes chopping the input signal at the chopping frequency to generate a chopped input signal and combining the chopped input signal and the offset correction signal to reduce input offset error of the signal amplification block.

DETAILED DESCRIPTION OF EMBODIMENTS

Figure 1:
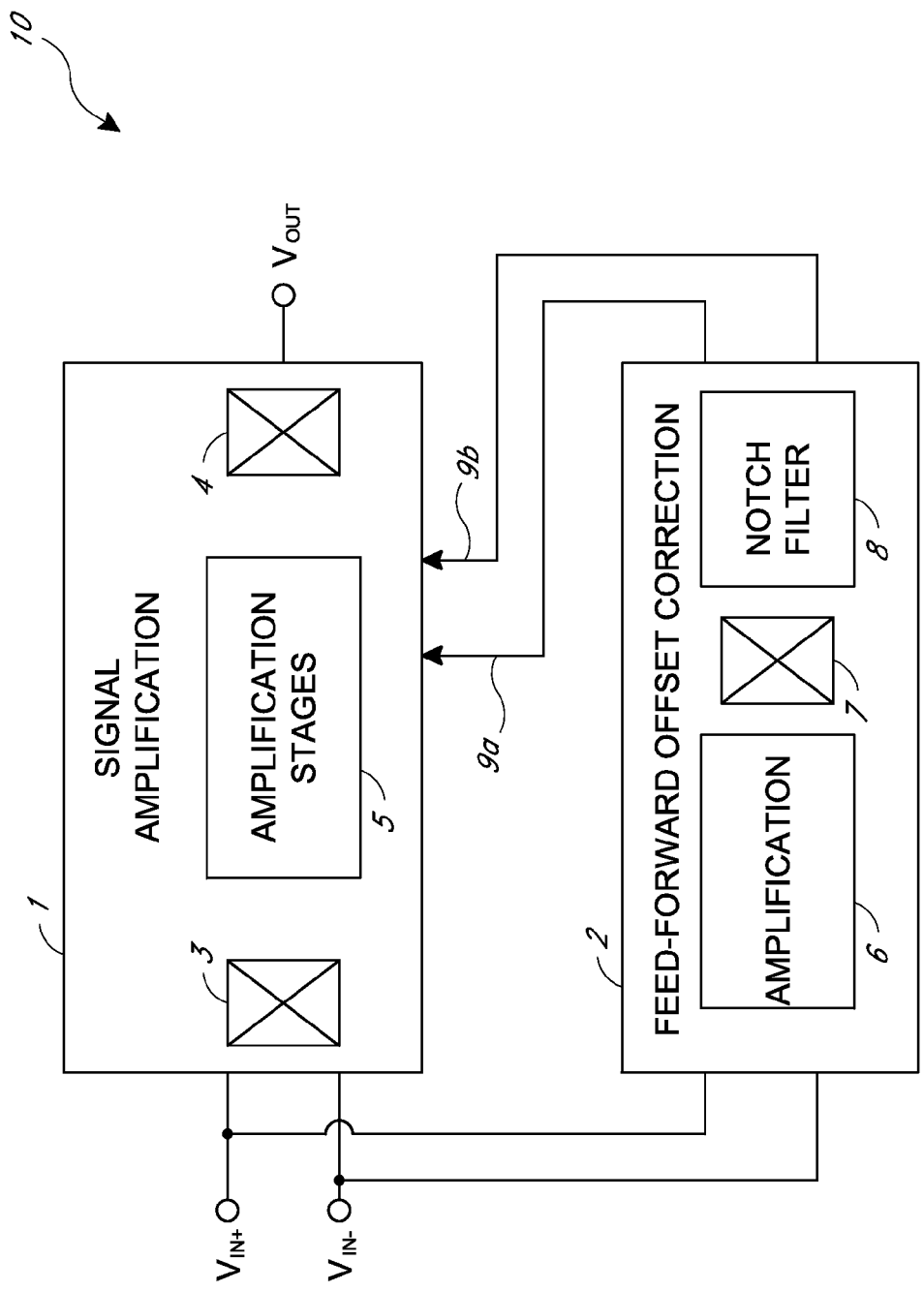
FIG. 1 is a schematic block diagram illustrating one embodiment of an amplifier.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Amplifiers and methods of electronic amplification are provided herein. In certain implementations, an amplifier includes a signal amplification block and a feed-forward offset correction block. The signal amplification block amplifies a differential input voltage signal of the amplifier to generate an output signal of the amplifier, and the feed-forward offset correction block generates an input offset correction signal that the signal amplification block can use to reduce or remove the amplifier's input offset voltage. In certain configurations, the feed-forward offset correction block includes a feed-forward amplification block for amplifying the differential input voltage signal, a feed-forward chopping circuit for chopping the output of the feed-forward amplification block at a chopping frequency, and a notch filter for generating the input offset correction signal by filtering or notching the output of the feed-forward chopping circuit at the chopping frequency. Additionally, the signal amplification block is configured to chop the input signal at the chopping frequency and to combine the chopped input signal with the input offset correction signal. The signal amplification block can be configured to further amplify the combined signal and to chop the amplified combined signal at the chopping frequency to generate the amplifier's output. Frequency components of the input offset correction signal at or near the chopping frequency can have a relative small magnitude relative to other frequency components of the input offset correction signal, such as DC or low frequency components. Thus, the input offset correction signal can have a relatively low input offset voltage error and can be used to provide feed-forward input offset correction to the signal amplification block to reduce the amplifier's input offset voltage.

Overview of Embodiments of Chopper-Stabilized Amplifiers

FIG. 1 is a schematic block diagram illustrating one embodiment of an amplifier 10. The amplifier 10 includes a signal amplification block 1 and a feed-forward offset correction block 2. The signal amplification block 1 includes a first or input chopping circuit 3, a second or output chopping circuit 4, and amplification stages 5. The feed-forward offset correction block 2 includes a feed-forward amplification block 6, a third or feed-forward chopping circuit 7, and a notch filter 8.

The amplifier 10 includes a positive or non-inverted input voltage terminal $V_{IN+}$, a negative or inverted input voltage terminal $V_{IN-}$, and an output voltage terminal $V_{OUT}$. The amplifier 10 can receive a differential input voltage signal between the positive and negative input voltage terminals $V_{IN+}$, $V_{IN-}$, and can amplify the differential input voltage signal to generate an output voltage signal on the output voltage terminal $V_{OUT}$. The feed-forward offset correction block 2 is configured to receive the differential input voltage signal and to generate a positive or non-inverted input offset correction signal 9a and a negative or inverted input offset correction signal 9b, which collectively operate as a differential input offset correction signal 9a, 9b. The signal amplification block 1 is configured to receive the differential input voltage signal from the positive and negative input voltage terminals $V_{IN+}$, $V_{IN-}$, to receive the differential input offset correction signal 9a, 9b, and to generate the output voltage signal on the output voltage terminal $V_{OUT}$. Although FIG. 1 illustrates a configuration in which the amplifier 10 generates a single-ended output voltage signal, the amplifier 10 can be adapted to generate other output signals, including, for example, a differential output voltage signal and/or a single-ended or differential output current signal. Additionally, although FIG. 1 illustrates the amplifier 10 in an open-loop configuration, the amplifier 10 can be used in closed-loop implementations.

The signal amplification block 1 includes the amplification stages 5, which can include multiple amplification circuits or stages used to achieve a desired overall gain and performance of the amplifier 10. For example, the amplifier 10 can be configured to have a gain equal to about the product of the gain of each amplification circuit of the amplification stages 5. The use of multiple amplification circuits can also aid in increasing the input impedance and/or reducing the output impedance of the amplifier 10 relative to an amplifier that uses a single stage.

The input and output chopping circuits 3, 4 can be used to provide chopping to the amplifier 10 to help reduce error in the output voltage signal associated with input offset voltage. As used herein, input offset voltage can refer to a DC voltage between positive and negative input voltage terminals $V_{IN+}$, $V_{IN-}$ that corresponds to an output voltage of about 0 V. The input chopping circuit 3 can be used to regularly reverse the polarity of the differential input voltage signal received between the positive and negative input voltage terminals $V_{IN+}$, $V_{IN-}$ provided to the amplification stages 5. To maintain the signal polarity of the amplifier's output signal, the output chopping circuit 4 can be used to chop an amplified differential signal of the amplification stages 5, such as positive and negative output signals from one of the amplification circuits associated with the amplification stages 5.

The amplifier 10 further includes the feed-forward offset correction block 2, which can generate the differential input offset correction signal 9a, 9b used to reduce or remove the amplifier's input offset voltage error. For example, the feed-forward amplification block 6 can be used to amplify the differential input voltage signal to generate a feed-forward signal, and the feed-forward chopping circuit 7 can be used to chop the feed-forward signal. The notch filter 8 can notch or filter the output of the feed-forward chopping circuit 7 near the chopping frequency to generate a notched signal having reduced or attenuated frequency content near the chopping frequency relative to other frequency components of the notched signal. In certain implementations, the notched signal is used as the differential input offset correction signal 9a, 9b. However, other implementations are possible, such as configurations in which the feed-forward offset correction block 2 amplifies the notched signal to generate the differential input offset correction signal 9a, 9b.

The feed-forward chopping circuit 7 is used to chop the output of the feed-forward amplification block 6, and thus the output of the feed-forward chopping circuit 7 can have a magnitude near the chopping frequency that is about proportional to the input offset voltage of the feed-forward amplification block 6. For example, in the absence of an input signal to the feed-forward amplification block 6, the output signal of the feed-forward chopping circuit 7 can be a square wave signal with a magnitude proportional to the input offset voltage of the feed-forward amplification block 6 and a frequency about equal to the chopping frequency. Since such a square wave signal can be equivalently represented by a Fourier series of sine waves at the chopping frequency and at odd harmonics thereof, the output signal of the feed-forward chopping circuit 7 near the chopping frequency can have a magnitude that changes in proportion to the input offset voltage of the feed-forward amplification block 6.

By using the notch filter 8 to attenuate or notch the output of the feed-forward chopping circuit 7 near the chopping frequency, the differential input offset correction signal 9a, 9b can have reduced or removed input offset voltage error. Thus, the feed-forward chopping circuit 7 and the notch filter 8 can be used to reduce or remove input offset voltage error of the feed-forward amplification block 6, thereby configuring the feed-forward offset correction block 2 to generate an output similar to that of an ideal amplifier having little or no input offset voltage.

The differential input offset correction signal 9a, 9b can be provided to the signal amplification block 1, and can be combined with the output of the input chopping circuit 3 to generate a combined signal. The combined signal can be amplified using the amplification stages 5 and chopped using the output chopping circuit 4 to generate an output voltage signal on the output voltage terminal $V_{OUT}$. Since the differential input offset correction signal 9a, 9b is amplified by the gain of the feed-forward amplification block 6, and thus can be amplified relative to the output of the input chopping circuit 3, the differential input offset correction signal 9a, 9b can be used to control the gain versus frequency response of the signal amplification block 1 near the chopping frequency. Thus, the differential input offset correction signal 9a, 9b can be used to reduce or suppress an input offset voltage of the signal amplification block 1, thereby reducing the input offset voltage of the amplifier 10. Additionally, configuring the amplifier 10 in this manner can also reduce the amplifier's output error relative to that of a conventional chopper-stabilized amplifier, which can have ripple error in the output signal associated with spurs at the chopping frequency and at harmonics thereof.

In certain embodiments, the feed-forward offset correction block 2 can be active in controlling the amplifier's gain versus frequency response near the chopping frequency while having a relatively small impact on the amplifier's amplification of the input signal through the signal amplification block 1. For example, since the feed-forward chopping circuit 7 can operate to upshift the frequency content or spectrum of the input signal by the chopping frequency, the feed-forward offset correction block 2 can attenuate DC or low frequency input signals that are upshifted by the feed-forward chopping circuit 7 into the stop band of the notch filter 8. Thus, the feed-forward offset correction block 2 can provide little or no gain for DC and low frequency input signals and the signal amplification block 1 can be configured to control signal amplification at low frequencies.

Additionally, in certain embodiments, the feed-forward offset correction block 2 can be configured to have bandwidth less than a bandwidth of the signal amplification block 1 such that the feed-forward offset correction block 2 has a relatively small impact on signal amplification at high frequencies. For example, the input chopping circuit 3 can upshift the frequency spectrum of the input signal by the chopping frequency, and the bandwidth of the feed-forward offset correction block 2 can be configured to be insufficient to amplify the upshifted input signal for high signal frequencies. Thus, the feed-forward offset correction block 2 can be configured to control the gain versus frequency response of the amplifier 10 near the chopping frequency while having a relatively small impact on the amplifier's amplification of the input signal through the signal amplification block 1.

In one embodiment, the bandwidth of the feed-forward offset correction block 2 is selected to be at least about 10 times less than a bandwidth of the signal amplification block 1. However, other bandwidth values will be readily determined by persons having ordinary skill in the art.

Figure 2:
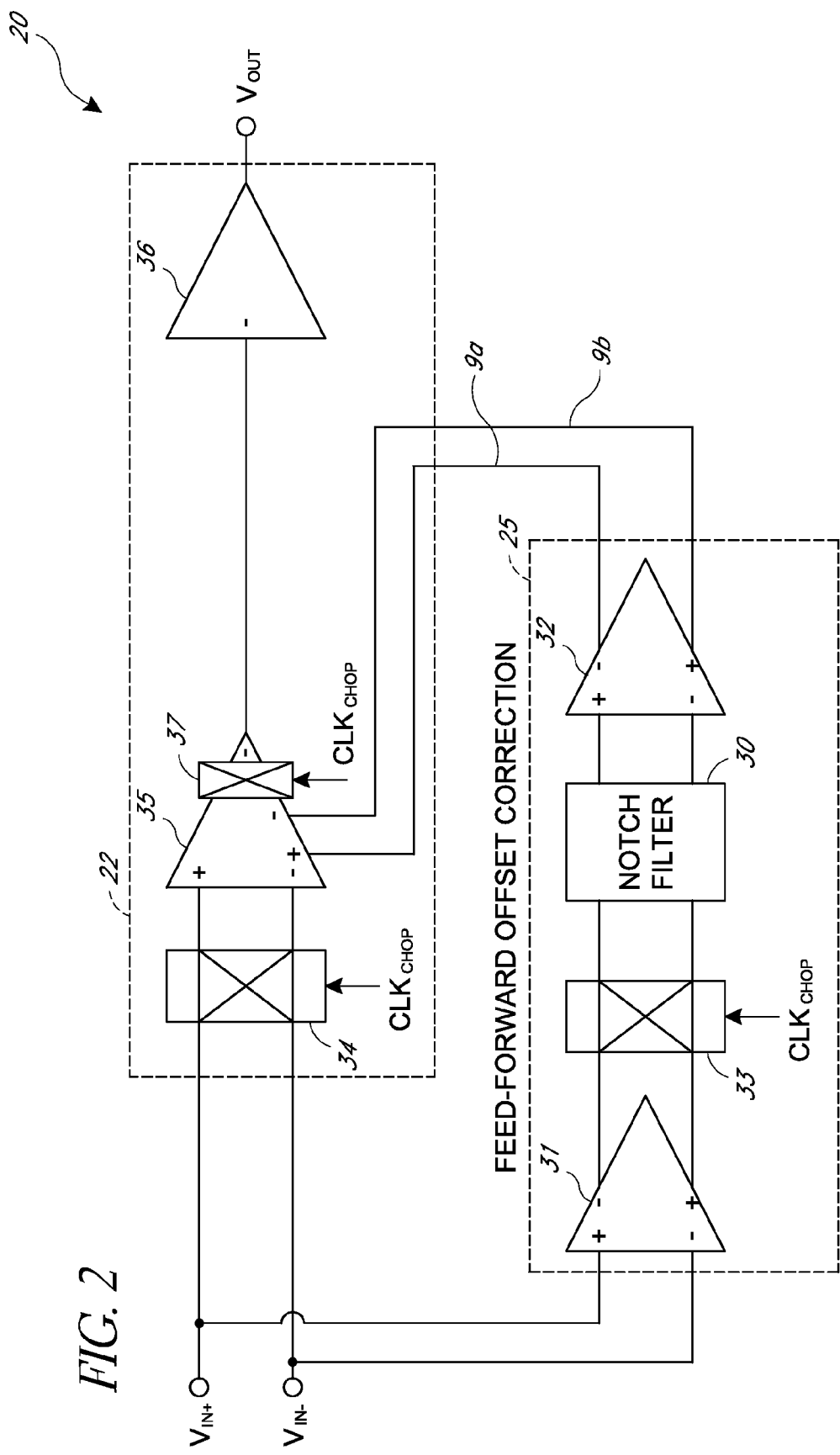
FIG. 2 is a circuit diagram illustrating one embodiment of an amplifier.

FIG. 2 is a circuit diagram illustrating one embodiment of an amplifier 20. The amplifier 20 includes a signal amplification block 22 and a feed-forward offset correction block 25. The signal amplification block 22 includes a first or input chopping circuit 34, a first or input amplification circuit 35, a second or output amplification circuit 36, and a second or output chopping circuit 37. In the configuration illustrated in FIG. 2, the output chopping circuit 37 has been implemented as part of the input amplification circuit 35, but other configurations are possible. The feed-forward offset correction block 25 includes a first feed-forward amplification circuit 31, a second feed-forward amplification circuit 32, a feed-forward chopping circuit 33, and a notch filter 30. The amplifier 20 can receive a differential input voltage signal between a positive input voltage terminal $V_{IN+}$ and a negative input voltage terminal $V_{IN-}$ and can amplify the differential input voltage signal to generate an output voltage signal on an output voltage terminal $V_{OUT}$.

The first feed-forward amplification circuit 31 includes a non-inverted input electrically connected to the positive input voltage terminal $V_{IN+}$ and an inverted input electrically connected to the negative input voltage terminal $V_{IN-}$. The first feed-forward amplification circuit 31 further includes an inverted output electrically connected to a first input of the feed-forward chopping circuit 33 and a non-inverted output electrically connected to a second input of the feed-forward chopping circuit 33. The feed-forward chopping circuit 33 further includes a clock input configured to receive a chopping clock signal $CLK_{CHOP}$, a first output electrically connected to a first input of the notch filter 30, and a second output electrically connected to a second input of the notch filter 30. The notch filter 30 further includes a first output electrically connected to a non-inverted input of the second feed-forward amplification block 32 and a second output electrically connected to an inverted input of the second feed-forward amplification block 32. The second feed-forward amplification block 32 further includes an inverted output configured to generate the positive input offset correction signal 9a and a non-inverted output configured to generate the negative input offset correction signal 9b.

The input chopping circuit 34 includes a first input electrically connected to the positive input voltage terminal $V_{IN+}$ and a second input electrically connected to the negative input voltage terminal $V_{IN-}$. The input chopping circuit 34 further includes a clock input configured to receive the chopping clock signal $CLK_{CHOP}$, a first output electrically connected to a non-inverted input of the input amplification circuit 35, and a second output electrically connected to an inverted input of the input amplification circuit 35. The input amplification circuit 35 further includes a non-inverted offset correction input configured to receive the non-inverted input offset correction signal 9a, an inverted offset correction input configured to receive the inverted input offset correction signal 9b, and an inverted output electrically connected to an inverted input of the output amplification circuit 36. The output amplification circuit 36 further includes a non-inverted output configured to generate the output signal of the amplifier 20 on the output voltage terminal $V_{OUT}$.

When the first feed-forward amplification circuit 31 does not receive a differential input voltage signal, the differential output voltage signal of the first feed-forward amplification circuit 31 can correspond to an amplified version of the input offset voltage of the first feed-forward amplification circuit 31. The feed-forward chopping circuit 33 can chop the differential output signal of the first feed-forward amplification circuit 31 by the chopping frequency of the chopping clock signal $CLK_{CHOP}$. Thereafter, the notch filter 30 can reduce or attenuate the magnitude of signal components of the output of the feed-forward chopping circuit 33 at the chopping frequency, thereby reducing the magnitude of frequency components associated with input offset voltage of the first feed-forward amplification circuit 31. The differential output signal of the notch filter 30 can be amplified using the second feed-forward amplification circuit 32 to generate the differential input offset correction signal 9a, 9b.

By using the notch filter 30 to attenuate or notch the output of the feed-forward chopping circuit 33 at the chopping frequency of the chopping clock signal $CLK_{CHOP}$, the differential input offset correction signal 9a, 9b can have reduced or removed input offset voltage error, thereby configuring the feed-forward offset correction block 25 to operate similar to that of an ideal amplifier having little or no input offset voltage.

The notch filter 30 can be any suitable notch filter, including, for example, a switched capacitor or zero-cross notch filter. The notch filter 30 can be configured to have any suitable stop-band, such as stop band that attenuate signals that are within about +/−10% of the chopping frequency by at least about 40 dB. In certain implementations, the notch filter 30 can be configured to substantially pass signals having a frequency outside of the stop band without attenuation. Although one embodiment of the notch filter 30 has been described, persons having ordinary skill in the art will readily ascertain other suitable implementations.

In the configuration illustrated in FIG. 2, the feed-forward offset correction block 25 utilizes a scheme in which the first feed-forward amplification circuit 31 is configured to receive the differential input voltage signal from the positive and negative input voltage terminals $V_{IN+}$, $V_{IN-}$ and the second feed-forward amplification circuit 32 is configured to generate the differential input offset correction signal 9a, 9b. Configuring the feed-forward offset correction block 25 in this manner can aid in reducing the power consumption of the feed-forward offset correction block 25. For example, since the notch filter 30 can filter the differential output signal of the feed-forward chopping circuit 33 at the chopping frequency prior to amplification by the second feed-forward amplification block 32, power associated with amplifying frequency content near the chopping frequency can be reduced. Thus, the implementation shown in FIG. 2 can reduce power consumption of the second feed-forward amplification block 32 relative to a scheme in which the first and second feed-forward amplification blocks 31, 32 are cascaded and configured to drive the inputs of the feed-forward chopping circuit 33.

The differential input offset correction signal 9a, 9b can be used to reduce or remove the input offset voltage error of the amplifier 20. For example, the input amplification circuit 35 can be configured to combine the differential input offset correction signal 9a, 9b with the differential output signal of the input chopping circuit 34. For instance, in certain implementations, the input amplification circuit 35 is configured to add the differential input offset correction signal 9a, 9b to the differential output signal of the input chopping circuit 34. Thereafter, the combined signal can be chopped using the output chopping circuit 37 and amplified using the output amplification circuit 36 to generate the output signal of the amplifier 20. Since the differential input offset correction signal 9a, 9b can be amplified by the gain of the feed-forward offset correction block 25 before it is combined with the differential output signal of the input chopping circuit 34, the feed-forward offset correction block 25 can be used to substantially control the gain versus frequency response of the signal amplification block 22 near the chopping frequency. In one embodiment, the gain of the feed-forward offset correction block 25 at the chopping frequency is selected to be at least 40 dB higher that a gain associated with the signal amplification block 22 at the chopping frequency. However, other gain values will be readily determined by persons having ordinary skill in the art.

The feed-forward offset correction block 25 can be configured to have a bandwidth less than a bandwidth of the signal amplification block 22 such that the feed-forward offset correction block 25 has a relatively small impact on signal amplification at high frequencies. Configuring the feed-forward offset correction block 25 in this manner can aid in reducing power consumption of the feed-forward offset correction block 25.

The feed-forward input offset voltage correction scheme shown in FIG. 2 can have reduced power consumption relative to a feedback implementation in which a differential feedback signal is used to reduce input offset error. For example, the illustrated scheme allows the differential input offset correction signal 9a, 9b to be combined with the chopped input signal relatively early in the signal amplification path, thereby permitting subsequent gain stages of the signal amplification block 22 to be single-ended. For example, the input amplification circuit 35 can generate a single-ended output signal, thereby reducing power consumption relative to a feedback scheme in which differential signaling is maintained to generate a differential feedback signal further in the signal amplification path.

Figure 3:
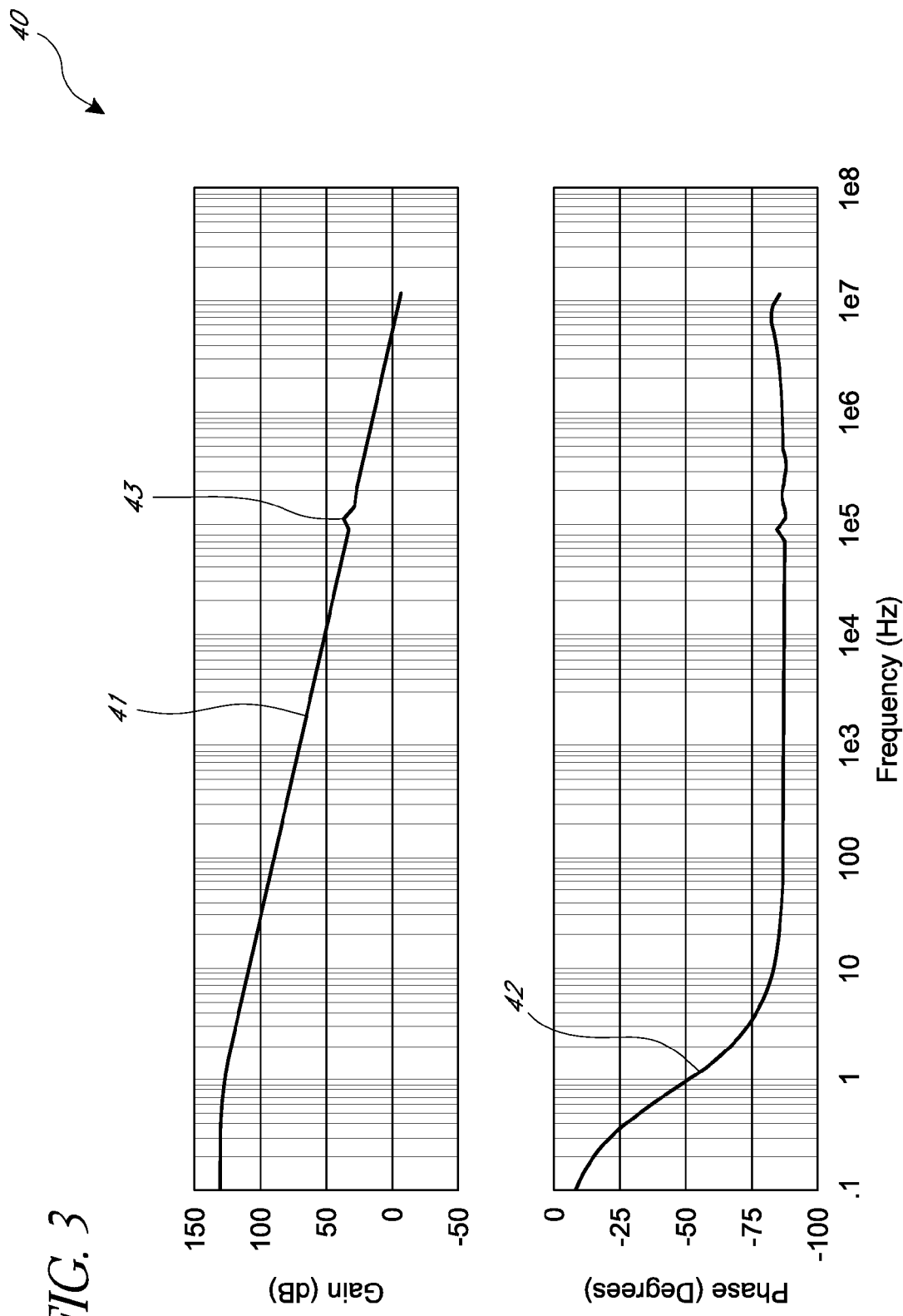
FIG. 3 is a graph of one example of gain versus frequency and phase versus frequency for the amplifier of FIG. 2.

FIG. 3 is a graph 40 of one example of gain versus frequency and phase versus frequency for the amplifier 20 of FIG. 2. The graph 40 includes a gain plot 41 of amplifier gain versus frequency and a phase plot 42 of amplifier phase versus frequency. The graph 40 illustrates gain and phase plots 41, 42 for one implementation of the amplifier 20 of FIG. 2 in which the chopping frequency of the chopping clock signal $CLK_{CHOP}$ is equal to about 100 kHz. As illustrated in FIG. 3, the gain plot 41 exhibits gain peaking 43 near the chopping frequency.

Although including the feed-forward offset correction block 25 in the amplifier 20 of FIG. 2 can reduce the amplifier's input offset voltage and reduce ripple in the amplifier's output voltage associated with frequency spurs at the chopping frequency and at harmonics thereof, the inclusion of the feed-forward offset correction block 25 can also impact the performance of the amplifier 20 when amplifying signals close to the chopping frequency of the chopping clock signal $CLK_{CHOP}$. For example, using a chopping circuit to chop the input signal at the chopping frequency can operate to modulate the input signal by the chopping clock signal $CLK_{CHOP}$, which can generate frequency content in the chopping circuit's output at both sum and difference frequencies of the signal frequency and the chopping frequency. When the feed-forward offset correction block 25 is chopping an input signal having a frequency component at or near the chopping frequency, the input signal can be downconverted to DC and pass without attenuation through the notch filter 30, which can result in the amplifier's gain plot 41 exhibiting gain peaking 43 near the chopping frequency.

Although gain peaking can be tolerated for many applications, various implementations of amplifiers having reduced gain peaking near the chopping frequency will be described below with reference to FIGS. 4-7.

Figure 4:
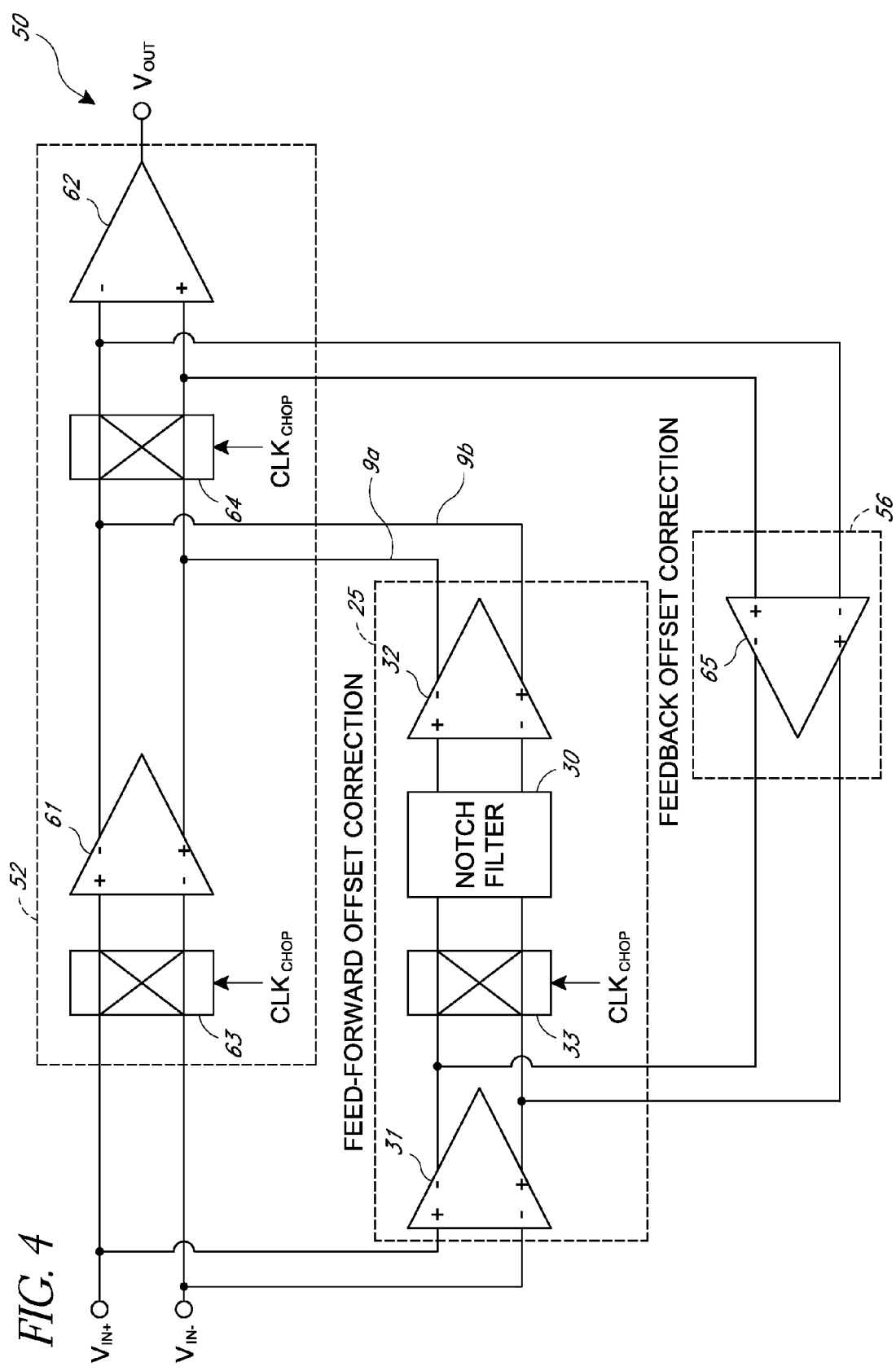
FIG. 4 is a circuit diagram illustrating another embodiment of an amplifier.

FIG. 4 is a circuit diagram illustrating another embodiment of an amplifier 50. The amplifier 50 can receive a differential input voltage signal between a positive input voltage terminal $V_{IN+}$ and a negative input voltage terminal $V_{IN-}$ and can amplify the differential input voltage signal to generate an output voltage signal on an output voltage terminal $V_{OUT}$. The amplifier 50 includes a signal amplification block 52, a feedback offset correction block 56, and the feed-forward offset correction block 25. The signal amplification block 22 includes a first or input amplification circuit 61, a second or output amplification circuit 62, a first or input chopping circuit 63, and a second or output chopping circuit 64. As was described above with respect to FIG. 2, the feed-forward offset correction block 25 includes the first feed-forward amplification circuit 31, the second feed-forward amplification circuit 32, the third chopping circuit 33, and the notch filter 30. The feed-forward offset correction block 25 is configured to receive the differential input signal from the positive and negative input voltage terminals $V_{IN+}$, $V_{IN-}$ and to generate a differential input offset correction signal 9a, 9b for the signal amplification block 52. The feedback offset correction block 56 includes a feedback amplification circuit 65.

The input chopping circuit 63 includes a first input electrically connected to the positive input voltage terminal $V_{IN+}$ and a second input electrically connected to the negative input voltage terminal $V_{IN-}$. The input chopping circuit 63 further includes a clock input configured to receive the chopping clock signal $CLK_{CHOP}$, a first output electrically connected to a non-inverted input of the input amplification circuit 61, and a second output electrically connected to an inverted input of the input amplification circuit 61. The input amplification circuit 61 further includes an inverted output electrically connected to a first input of the output chopping circuit 64 at a node configured to receive the inverted input offset correction signal 9b. The input amplification circuit 61 further includes a non-inverted output electrically connected to a second input of the output chopping circuit 64 at a node configured to receive the non-inverted input offset correction signal 9a. The output chopping circuit 64 further includes a clock input configured to receive the chopping clock signal $CLK_{CHOP}$, a first output electrically connected to an inverted input of the output amplification circuit 62 and to an inverted input of the feedback amplification circuit 65, and a second output electrically connected to a non-inverted input of the input amplification circuit 61 and to a non-inverted input of the feedback amplification circuit 65. The output amplification circuit 62 further includes an output electrically connected to the output voltage terminal $V_{OUT}$ and configured to generate the output voltage signal of the amplifier 50. The feedback amplification circuit 65 further includes an inverted output electrically connected to the first input of the third chopping circuit 33 and a non-inverted output electrically connected to the second input of the third chopping circuit 33.

The amplifier 50 has been configured to include the feedback offset correction block 56, which can amplify the output signal of the output chopping circuit 64 to generate a differential feedback signal that can be provided to the input of the third chopping circuit 33. The output of the third chopping circuit 33 can be notched by the notch filter 30 and amplified by the amplification block 32 and thereafter provided to the inputs of the output chopping circuit 64. By including a feedback path from the outputs of the output chopping block 64 to the inputs of the output chopping block 64 through the feedback amplification circuit 65, the chopping circuit 33, the notch filter 30, and the amplification circuit 32, the feedback offset correction block 56 can reduce the amplifier's input offset voltage by suppressing output signal ripples at the chopping frequency that are associated with input offset voltage of the first amplification circuit 61.

Although the amplifier 50 also includes the feed-forward offset correction block 25 which reduces input offset error of the signal amplification block 52 as was described earlier, including both the feed-forward offset correction block 25 and the feedback offset correction block 56 can reduce gain peaking of the amplifier 50 at the chopping frequency relative to the configuration shown in FIG. 2. In particular, the feedback offset correction block 56 can reduce input offset voltage by using feedback to attenuate frequency components in the output signal that are at or near the chopping frequency. However, the feedback offset correction block 56 also attenuates signal components that are at or near the chopping frequency. Thus, in contrast to the feed-forward offset correction block 25 that increases the gain of input signals at or near the chopping frequency, the feedback offset correction block 56 attenuates input signals at or near the chopping frequency. Accordingly, by tuning the strength or gain of the feed-forward offset correction block 25 relative to the strength or gain of the feedback offset correction block 56, the gain peaking of the feed-forward offset correction block 25 at the chopping frequency can be offset or canceled by a gain attenuation of the feedback offset correction block 56 at the chopping frequency.

Figure 5:
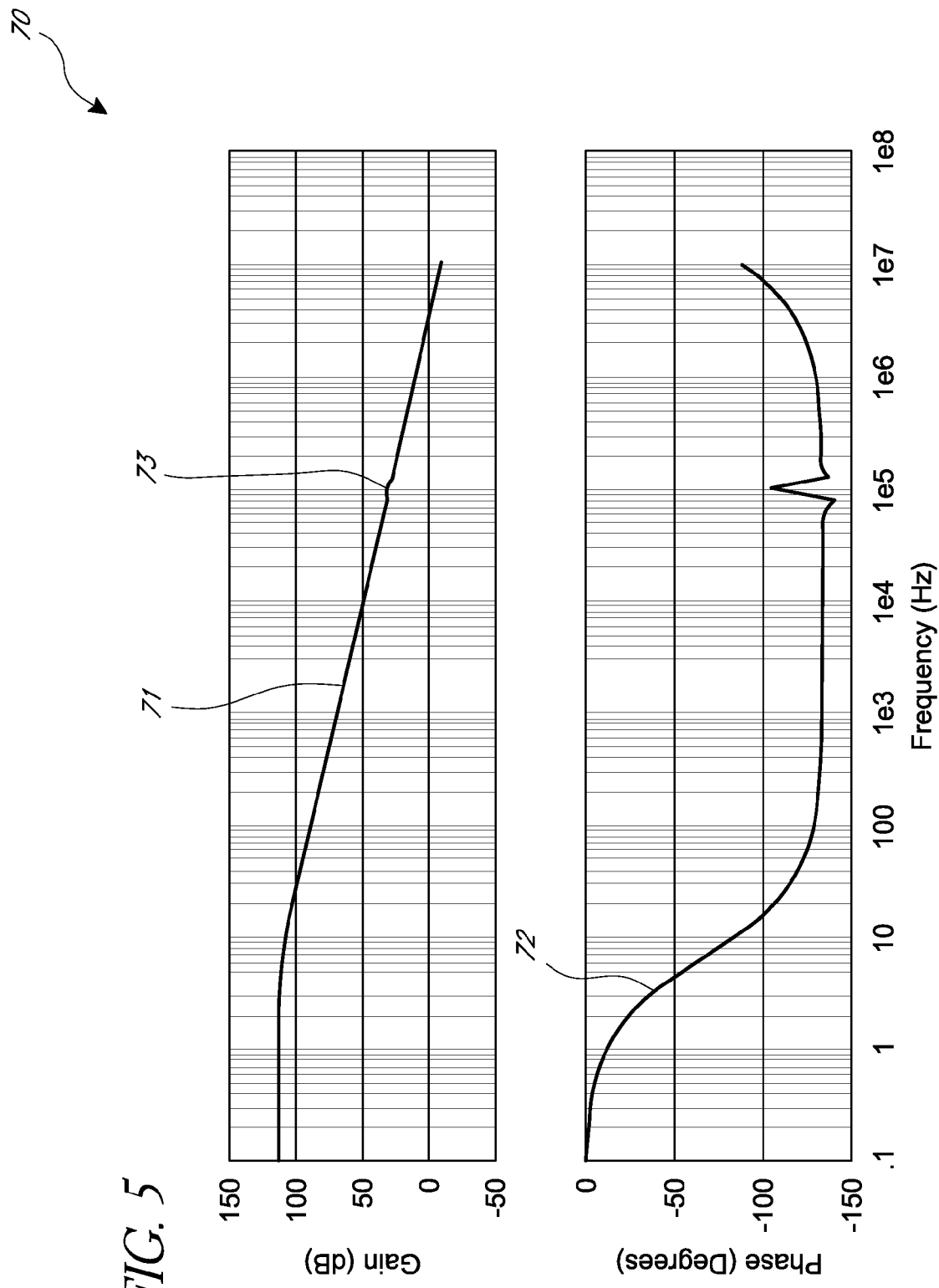
FIG. 5 is a graph of one example of gain versus frequency and phase versus frequency for the amplifier of FIG. 4.

FIG. 5 is a graph of one example of gain versus frequency and phase versus frequency for the amplifier of FIG. 4. The graph 70 includes a gain plot 71 of amplifier gain versus frequency and a phase plot 72 of amplifier phase versus frequency. The graph 70 illustrates gain and phase plots 71, 72 for one implementation of the amplifier 50 of FIG. 4 in which the chopping frequency of the chopping clock signal $CLK_{CHOP}$ is equal to about 100 kHz. As shown by a comparison of the gain plot 71 of FIG. 5 and the gain plot 41 of FIG. 3, gain peaking 73 near the chopping frequency has been reduced by including a feedback offset correction block in the amplifier.

Figure 6A:
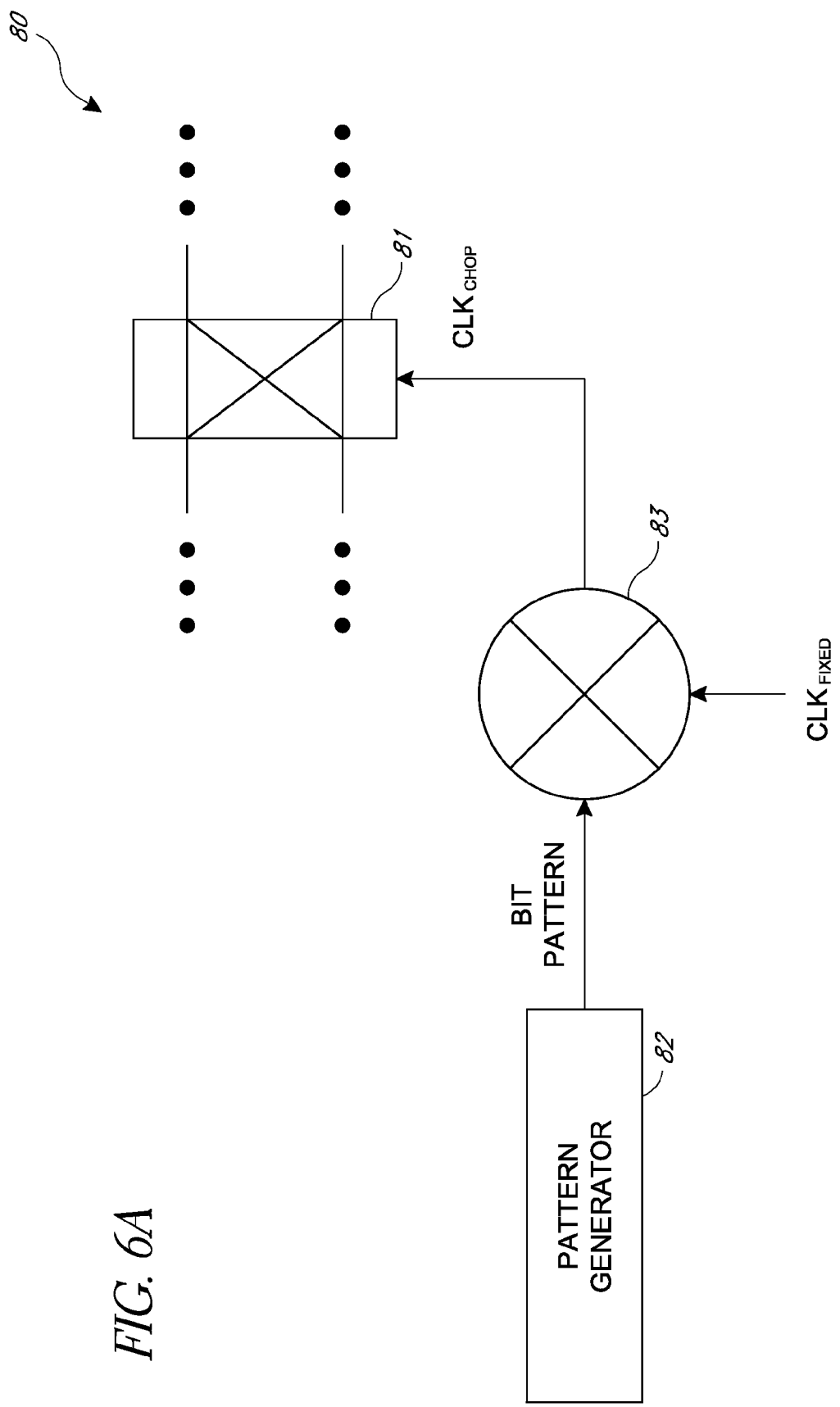
FIG. 6A is a schematic block diagram illustrating one embodiment of a randomized chopper.

FIG. 6A is a schematic block diagram illustrating one embodiment of a randomized chopper 80. The randomized chopper 80 includes a chopping circuit 81, a pattern generator 82, and a mixer 83. The randomized chopper 80 can be used in accordance with the amplifiers described herein.

The pattern generator 82 includes an output configured to generate a bit pattern, which can be a random or pseudo-random serial bit stream. The mixer 83 includes a first input configured to receive the bit pattern from the pattern generator 82 and a second input configured to receive a fixed clock signal $CLK_{FIXED}$, which can have a fixed or substantially constant frequency. The mixer 83 further includes an output electrically connected to a clock input of the chopping circuit 81. The mixer 83 can be configured to multiply the fixed clock signal $CLK_{FIXED}$ by the bit pattern to generate the chopping clock signal $CLK_{CHOP}$ on the output of the mixer 83. The chopping circuit 81 further includes a first input, a second input, a first output, and a second output, which can be connected within an amplifier to provide chopping. Although FIG. 6A illustrates the chopping clock signal $CLK_{CHOP}$ being provided to one chopping circuit, the randomized chopper 80 can be configured to provide the chopping clock signal $CLK_{CHOP}$ to multiple chopping circuits. For example, when incorporating the randomized chopper 80 into the amplifier 20 of FIG. 2, the mixer 83 can be configured to provide the chopping clock signal $CLK_{CHOP}$ to the input chopping circuit 34, to the output chopping circuit 37, and to the feed-forward chopping circuit 33.

The randomized chopper 80 can be used to reduce a variation in gain near the chopping frequency associated with using a feed-forward or feedback offset correction block. For example, as was described above with reference to FIG. 2, using a feed-forward offset correction block to provide input offset voltage reduction can result in gain peaking near the chopping frequency. By randomizing the chopping frequency using the randomized chopper 80 of FIG. 6A, gain peaking at the chopping frequency can be avoided by spreading out the frequency spectrum of the chopping clock signal $CLK_{CHOP}$. For example, rather than using a fixed chopping clock signal that can be equivalently represented by a Fourier series of sine waves at the chopping frequency and at odd harmonics thereof, the randomized chopper 80 of FIG. 6A generate a chopping clock signal $CLK_{CHOP}$ that has a frequency spectrum that is spread out over a wide range of frequencies. Thus, the randomized chopper 80 can be implemented in an amplifier than includes a feed-forward offset correction path to reduce gain peaking.

Figure 6B:
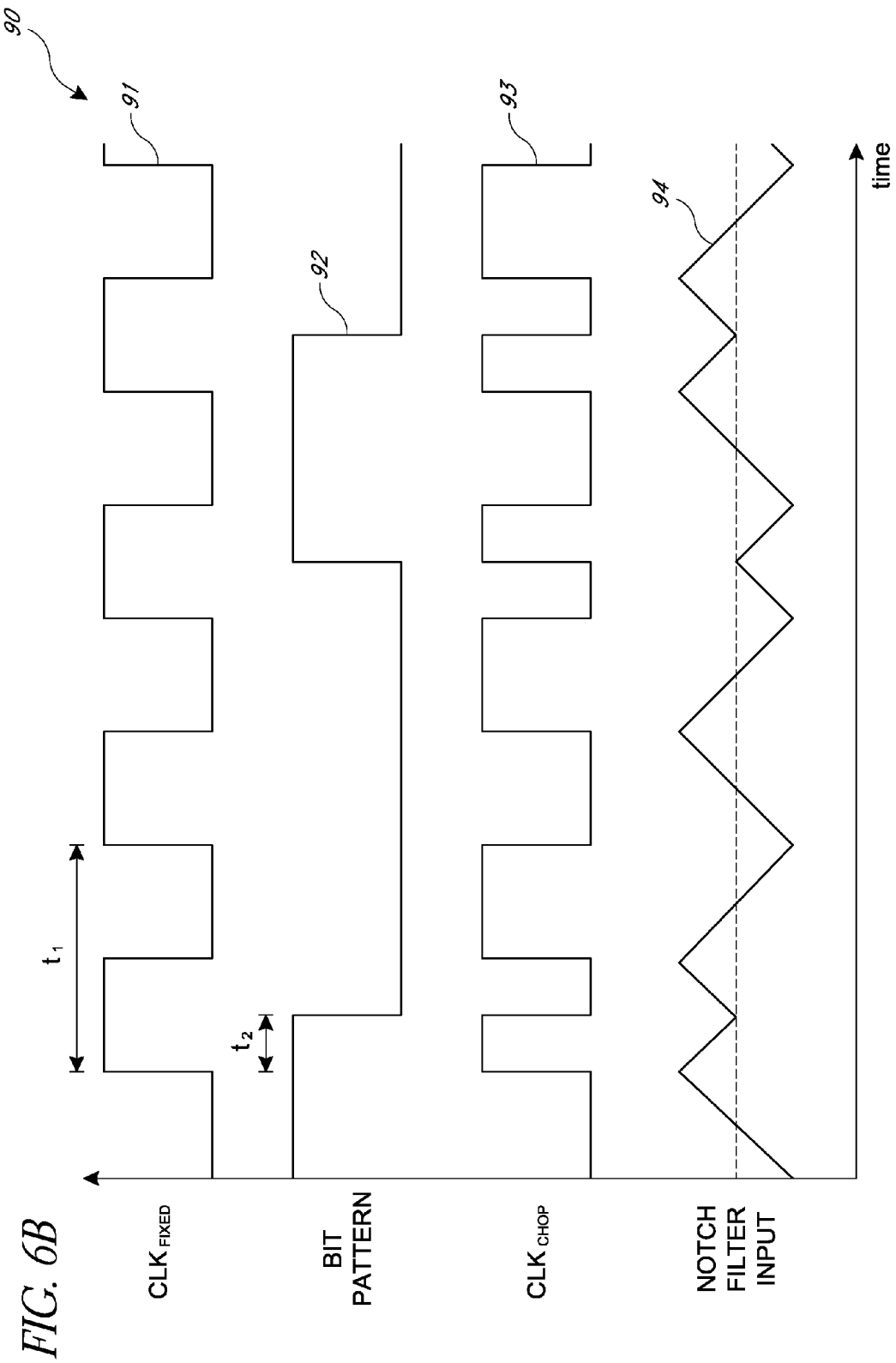
FIG. 6B is a timing diagram for one example of the randomized chopper of FIG. 6A.

FIG. 6B is a timing diagram 90 for one example of the randomized chopper 80 of FIG. 6A. The timing diagram 90 illustrates a configuration of the amplifier 20 of FIG. 2 in which the randomized chopper 80 has been included and configured to generate the chopping clock signal $CLK_{CHOP}$ for the feed-forward chopping circuit 33 as well as the input and output chopping circuits 34, 37. The timing diagram 90 includes a first plot 91 of the clock signal $CLK_{FIXED}$ received at the first input of the chopping circuit 81, a second plot 92 illustrating an example of the bit pattern received at the second input of the chopping circuit 81, and a third plot 93 illustrating the output of the chopping circuit 81. The timing diagram 90 has been illustrated to further include a fourth plot 94 illustrating one example of the input signal to a notch filter when using a zero-cross notch filter.

As shown in FIG. 6B, the clock signal $CLK_{FIXED}$ can have a constant period $t_1$. Additionally, the bit pattern shown in the second plot 92 can have an output that can change randomly or pseudo-randomly with the period $t_1$. The clock signal $CLK_{FIXED}$ and the bit pattern need not have a phase that is aligned. Rather, the bit pattern can be delayed relative to the clock signal $CLK_{FIXED}$ by a delay $t_2$, which can be, for example, ¼ or ¾ the period $t_1$.

The fourth plot 94 shows one example of the input signal to the notch filter in a configuration using a zero-cross notch filter. In such implementations, the input to the notch filter is slewed and the output of the notch filter is generated by sampling the input of the notch filter at about twice the chopping frequency of the chopping clock signal $CLK_{CHOP}$. As shown in FIG. 6B, even for a randomized chopping clock signal $CLK_{CHOP}$ the notch filter input crosses a reference voltage that can be used for zero-cross sampling. Although FIG. 6B illustrates a notch filter input for a zero-cross notch filter, other implementations of the notch filter can be used herein.

Figure 7:
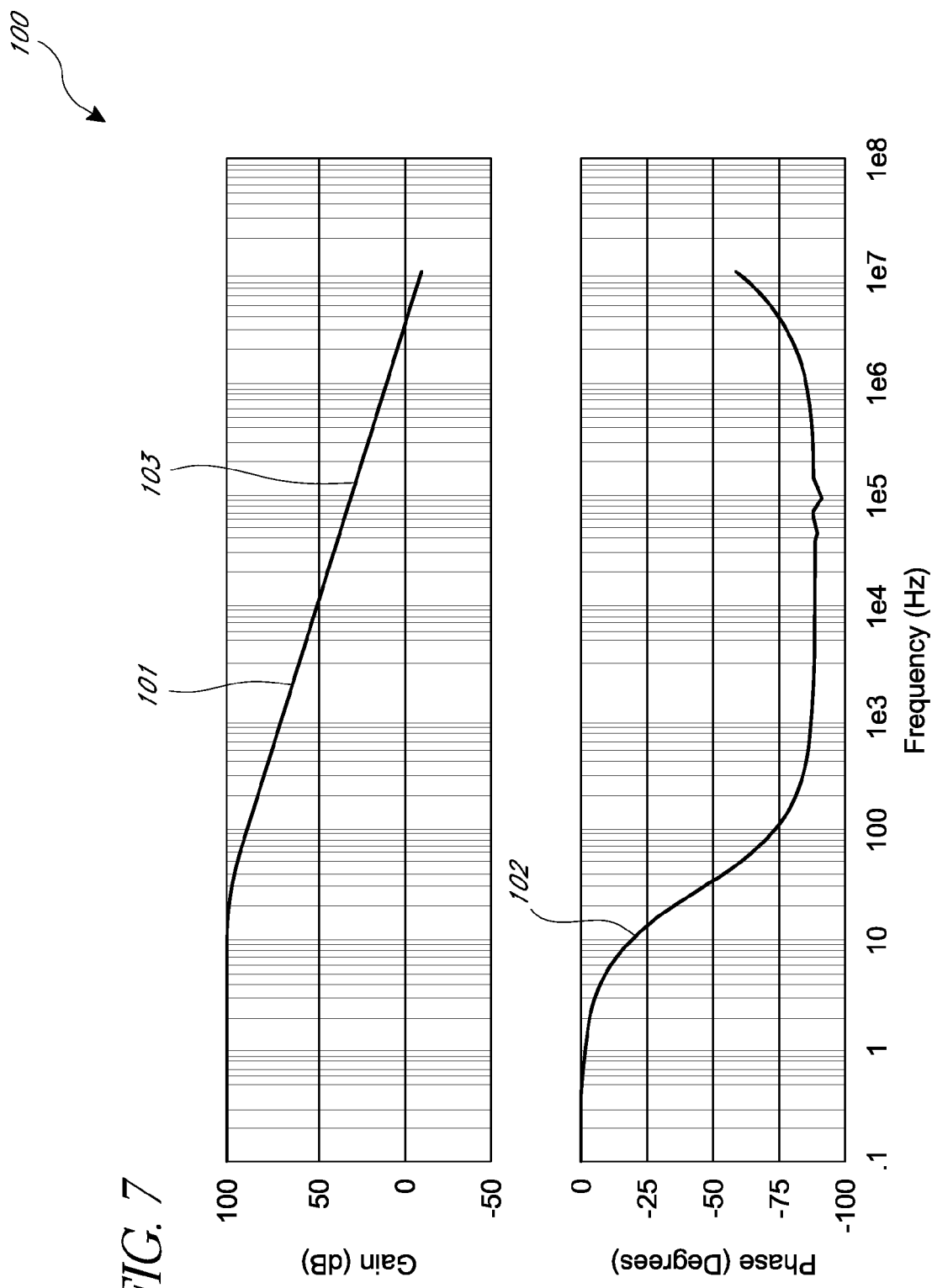
FIG. 7 is a graph of one example of gain versus frequency and phase versus frequency for an amplifier using the randomized chopper of FIG. 6A.

FIG. 7 is a graph 100 of one example of gain versus frequency and phase versus frequency for an amplifier using the randomized chopper 80 of FIG. 6A. The graph 100 includes a gain plot 101 of amplifier gain versus frequency and a phase plot 102 of amplifier phase versus frequency. The graph 100 illustrates gain and phase plots 101, 102 for one implementation of the amplifier 20 of FIG. 2 in which the randomized chopper 80 of FIG. 6A is used to generate the chopping clock signal $CLK_{CHOP}$. The randomized chopper uses a mixer configured to receive a bit pattern and a fixed-frequency clock $CLK_{FIXED}$ equal to about 100 kHz. As shown by a comparison of the gain plot 101 of FIG. 7 and the gain plot 41 of FIG. 3, gain peaking 103 has been reduced by including the randomized chopper.

Figure 8:
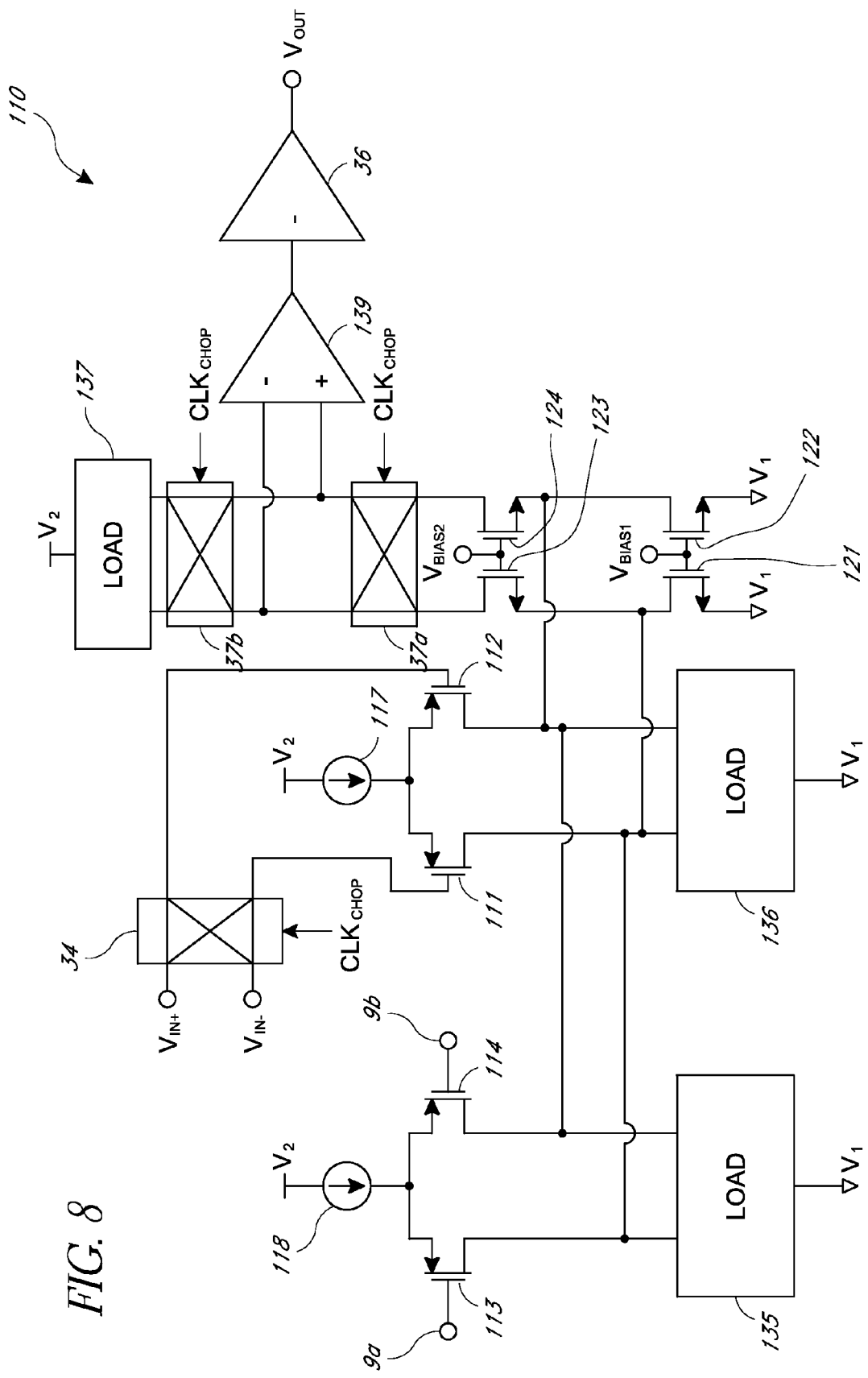
FIG. 8 is a circuit diagram of one embodiment of a signal amplification block.

FIG. 8 is a circuit diagram of one embodiment of a signal amplification block 110. The signal amplification block 110 can be configured to operate, for example, as the signal amplification block 22 of FIG. 2. The signal amplification block 110 is configured to receive a differential input voltage signal from the positive and negative input voltage terminals $V_{IN+}$, $V_{IN-}$, to receive the differential input offset correction signal 9a, 9b, and to generate the output voltage signal on the output voltage terminal $V_{OUT}$.

The signal amplification block 110 includes first to fourth p-type metal oxide semiconductor (PMOS) transistors 111-114, a first current source 117, a second current source 118, first to fourth n-type metal oxide semiconductor (NMOS) transistors 121-124, the input chopping circuit 34, a first output chopping circuit 37a, a second output chopping circuit 37b, first to third load blocks 135-137, a differential to single-ended amplification circuit 139, and the output amplification circuit 36. As used herein and as persons having ordinary skill in the art will appreciate, MOS transistors can have gates made out of materials that are not metals, such as poly silicon, and can have dielectric regions implemented not just with silicon oxide, but with other dielectrics, such as high-k dielectrics. Additionally, the signal amplification blocks described here can be implemented not just with MOS transistors, but with other structures, such as bipolar transistors.

The input chopping circuit 34 includes a first input electrically connected to the positive input voltage terminal $V_{IN+}$ and a second input electrically connected to the negative input voltage terminal $V_{IN-}$. The input chopping circuit 34 further includes a clock input configured to receive the chopping clock signal $CLK_{CHOP}$, a first output electrically connected to a gate of the first PMOS transistor 111, and a second output electrically connected to a gate of the second PMOS transistor 112. The first PMOS transistor 111 further includes a source electrically connected to a source of the second PMOS transistor 112 and to a first terminal of the first current source 118. The first PMOS transistor 111 further includes a drain electrically connected to a drain of the third PMOS transistor 113, to a drain of the first NMOS transistor 121, to a source of the third NMOS transistor 123, to a first terminal of the first load block 135, and to a first terminal of the second load block 136.

The second PMOS transistor 112 further includes a drain electrically connected to a drain of the fourth PMOS transistor 114, to a drain of the second NMOS transistor 122, to a source of the fourth NMOS transistor 124, to a second terminal of the first load block 135, and to a second terminal of the second load block 136. The first and second load blocks 135, 136 each further include a third terminal electrically connected to a first or power low supply voltage $V_1$. The first to third load blocks 135-137 can be any suitable load blocks, including those including resistors formed from passive components and/or active components biased to provide a desired resistance.

The third PMOS transistor 113 further includes a gate configured to receive the non-inverted input offset correction signal 9a and the fourth PMOS transistor 114 further includes a gate configured to receive the inverted input offset correction signal 9b. The third PMOS transistor 113 further includes a source electrically connected to a source of the fourth PMOS transistor 114 and to a first terminal of the first current source 117. The first and second current sources 117, 118 each further include a second end electrically connected to a second or power high supply voltage $V_2$. The first and second NMOS transistors 121, 122 each further include a source electrically connected to the power low supply voltage $V_1$ and a gate electrically connected to a first bias voltage $V_{BIAS1}$. The third and fourth NMOS transistors 123, 124 each further include a gate electrically connected to a second bias voltage $V_{BIAS2}$. The third NMOS transistor 123 further includes a drain electrically connected to a first input of the first output chopping circuit 37a. The fourth NMOS transistor 124 further includes a drain electrically connected to a second input of the first output chopping circuit 37a. The first output chopping circuit 37a further includes a clock input configured to receive the chopping clock signal $CLK_{CHOP}$, a first output electrically connected to a first input of the second output chopping circuit 37b and to an inverted input of the differential to single-ended amplification circuit 139, and a second output electrically connected to a second input of the second output chopping circuit 37b and to a non-inverted input of the differential to single-ended amplification circuit 139. The second output chopping circuit 37b further includes a clock input configured to receive the chopping clock signal $CLK_{CHOP}$, a first output electrically connected to a first terminal of the third load block 137, and a second output electrically connected to a second terminal of the third load block 137. The third load block 137 further includes a third terminal electrically connected to the power high supply voltage $V_2$. The differential to single-ended amplification circuit 139 further includes an output electrically connected to an inverted input of the output amplification circuit 36. The output amplification circuit 36 further includes an output electrically connected to the output voltage terminal $V_{OUT}$.

The signal amplification block 110 can be used to amplify the differential input voltage signal received between the positive and negative input voltage terminals $V_{IN+}$, $V_{IN-}$ to generate an output voltage signal on the output voltage terminal $V_{OUT}$. Additionally, the signal amplification block 110 can use the differential input offset correction signal 9a, 9b to reduce or suppress a voltage ripple in the output voltage signal that is associated with input offset voltage of the signal amplification block 110. For example, the differential input offset correction signal 9a, 9b can be associated with an amplified version of the differential input signal having frequency content upshifted to the chopping frequency and notched at the chopping frequency to remove input offset voltage error. As illustrated in FIG. 8, the first to fourth PMOS transistors 111-114 can be used to combine the differential input offset correction signal 9a, 9b with the chopped differential input signal. By combining the signals in this manner, the ripple in the output voltage signal of the signal amplification block 110 can be reduced.

The first output chopping circuit 37a can be used to regularly or repeatedly swap the connections between the drains of the third and fourth NMOS transistors 123, 124 and the non-inverted and inverted inputs of the differential to single-ended amplification circuit 139. Additionally, the first and second output chopping circuits 37a, 37b can be used to regularly swap the connections between the first and second terminals of the third load block 137 and the non-inverted and inverted inputs of the differential to single-ended amplification circuit 139. The first and second output chopping circuits 37a, 37b can be configured to collectively operate as the output chopping circuit 37 of FIG. 2. Although FIG. 8 illustrates one implementation of output chopping circuitry, other configurations can be used.

The output amplification circuit 36 can aid in improving the performance of the signal amplification block 110. For example, the output amplification circuit 36 can be used to boost the gain of the signal amplification block 110, thereby improving the performance of the signal amplification block 110 relative to a configuration in which the differential to single-ended amplification circuit 139 directly drives the output voltage terminal $V_{OUT}$.

Although the signal amplification block 110 illustrates one example of a signal amplification block suitable for use with the amplifier 10 of FIG. 1 and the amplifier 20 of FIG. 2, persons having ordinary skill in the art will appreciate that any other suitable signal amplification block 110 can be used in the amplifiers described herein.

Figure 9:
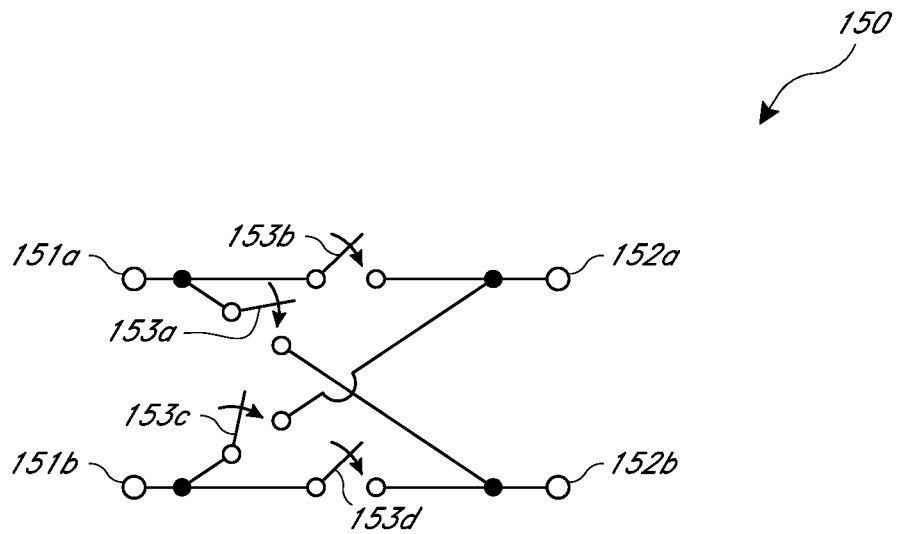
FIG. 9 is a circuit diagram of one example of a chopping circuit.

FIG. 9 is a circuit diagram of one example of a chopping circuit 150. The chopping circuit 150 includes first and second inputs 151a, 151b, first and second outputs 152a, 152b, and first to fourth switches 153a-153d. Although not illustrated in FIG. 9 for clarity, the chopping circuit 150 can receive a chopping clock signal $CLK_{CHOP}$, which can be used to control a state of the switches 153a-153d over time.

The first input 151a is electrically connected to a first end of the first switch 153a and to a first end of the second switch 153b. The second input 151b is electrically connected to a first end of the third switch 153c and to a first end of the fourth switch 153d. The first output 152a is electrically connected to a second end of the second switch 153b and to a second end of the third switch 153c. The second output 152b is electrically connected to a second end of the first switch 153a and to a second end of the fourth switch 153d.

The chopping circuit 150 can be used to chop an input signal received between the first and second inputs 151a, 151b to generate a chopped signal between the first and second outputs 152a, 152b. For example, during a first clock phase of the chopping clock signal $CLK_{CHOP}$, the chopping circuit 150 can close the second and fourth switches 153b, 153d and open the first and third switches 153a, 153c. Additionally, during a second clock phase of the chopping clock signal $CLK_{CHOP}$, the chopping circuit 150 can close the first and third switches 153a, 153c and open the second and fourth switches 153b, 153d. Although the chopping circuit 150 illustrates one example of a chopping circuit suitable for use with the amplifiers described herein, other configurations of chopping circuits can be used.

Figure 10:
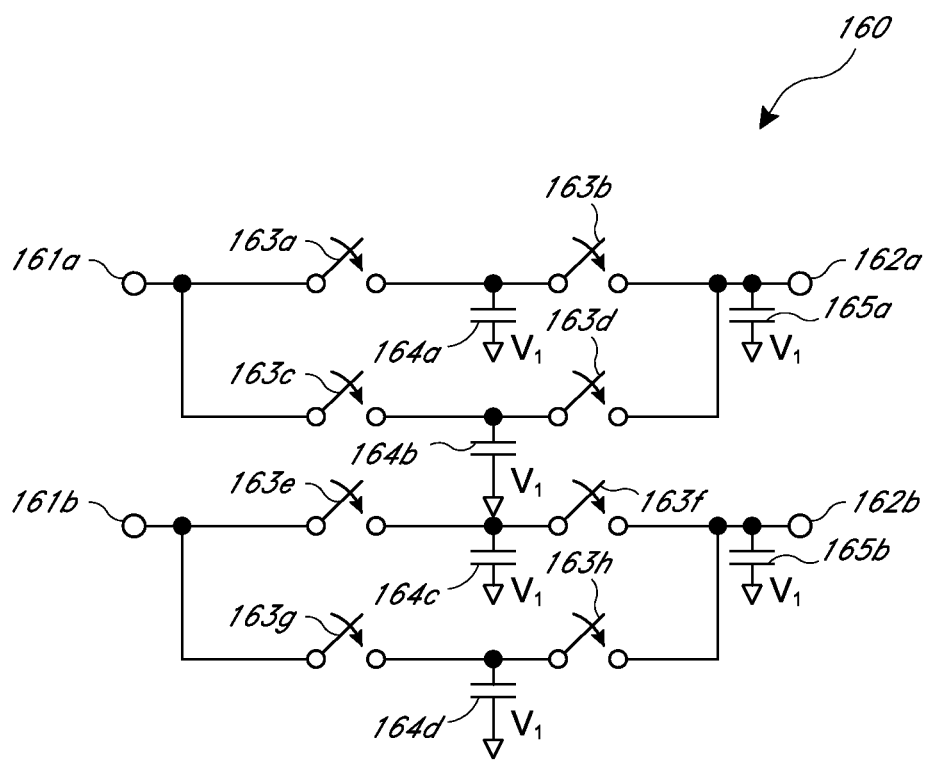
FIG. 10 is a circuit diagram of one example of a notch filter.

FIG. 10 is a circuit diagram of one example of a notch filter 160. The notch filter 160 includes first and second inputs 161a, 161b, first and second outputs 162a, 162b, first to eighth switches 163a-163h, first to fourth sampling capacitors 164a-164d, and first and second output capacitors 165a, 165b. Although not illustrated in FIG. 10 for clarity, the notch filter 160 can receive a notching clock signal $CLK_{NOTCH}$, which can be used to control a state of the switches 163a-163h over time. In certain implementations, the notching clock signal $CLK_{NOTCH}$ is configured to have about the same frequency as the chopping clock signal $CLK_{CHOP}$, but a phase difference that is about 90°. However, other implementations are possible.

The first input 161a is electrically connected to a first end of the first switch 163a and to a first end of the third switch 163c. The first switch 163a further includes a second end electrically connected to a first end of the second switch 163b and to a first end of the first sampling capacitor 164a. The third switch 163c further includes a second end electrically connected to a first end of the fourth switch 163d and to a first end of the second sampling capacitor 164b. The first output 162a is electrically connected to a second end of the second switch 163b, to a second end of the fourth switch 163d, and to a first end of the first output capacitor 165a. The second input 161b is electrically connected to a first end of the fifth switch 163e and to a first end of the seventh switch 163g. The fifth switch 163e further includes a second end electrically connected to a first end of the sixth switch 163f and to a first end of the third sampling capacitor 164c. The seventh switch 163g further includes a second end electrically connected to a first end of the eighth switch 163h and to a first end of the fourth sampling capacitor 164d. The second output 162b is electrically connected to a second end of the sixth switch 163f, to a second end of the eighth switch 163h, and to a first end of the second output capacitor 165b. The first to fourth sampling capacitors 164a-164d and the first and second output capacitors 165a, 165b each further include a second end electrically connected to the power low supply voltage $V_1$.

The notch filter 160 can be used to notch an input signal received between the first and second inputs 161a, 161b to generate a notched signal on the first and second outputs 162a, 162b. For example, during a first clock phase of the notching clock signal $CLK_{NOTCH}$, the notch filter 160 can be configured to close the first, fourth, fifth, and eighth switches 163a, 163d, 163e, 163h and to open the second, third, sixth, and seventh switches 163b, 163c, 163f, 163g. Additionally, during a second clock phase of the notching clock signal $CLK_{NOTCH}$, the notch filter 160 can be configured to open the first, fourth, fifth, and eighth switches 163a, 163d, 163e, 163h and to close the second, third, sixth, and seventh switches 163b, 163c, 163f, 163g. Since the notching clock signal $CLK_{NOTCH}$ can be configured to have about the same frequency as the chopping clock signal $CLK_{CHOP}$, the notch filter 160 can sample the input signal at the chopping frequency and average the samples to generate the notched signal. Configuring the notch filter 160 to sample the input signal at the chopping frequency can operate to notch frequency components of the input signal that are at the chopping frequency.

Although the notch filter 160 illustrates one example of a notch circuit suitable for use with the amplifiers described herein, other configurations of notch filters can be used.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the Figures depict example arrangements of elements and components, additional intervening elements, devices, features, or components may be present in an actual embodiment (assuming that the functionality of the depicted circuits is not adversely affected).

Applications

Devices employing the above described schemes can be implemented into various electronic devices. Examples of the electronic devices can include, but are not limited to, medical imaging and monitoring, consumer electronic products, parts of the consumer electronic products, electronic test equipment, etc. Examples of the electronic devices can also include memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An amplifier comprising:
   a signal amplification block configured to receive a differential input voltage signal and to amplify the differential input voltage signal to generate an output signal; and
   a feed-forward offset correction block configured to receive the differential input voltage signal and to generate an input offset correction signal, wherein the feed-forward offset correction block comprises:
      a first feed-forward amplification circuit configured to amplify the differential input voltage signal to generate a feed-forward signal;
      a feed-forward chopping circuit configured to chop the feed-forward signal at a chopping frequency to generate a chopped feed-forward signal; and
      a notch filter configured to attenuate the chopped feed-forward signal at the chopping frequency to generate a notched signal, wherein the feed-forward offset correction block is configured to generate the input offset correction signal based at least partly on the notched signal, and
   wherein the signal amplification block is further configured to receive the input offset correction signal from the feed-forward offset correction block and to reduce an input offset voltage of the amplifier using the input offset correction signal.

2. The amplifier of claim 1, wherein a bandwidth of the feed-forward offset correction block is configured to be at least about 10 times less than a bandwidth of the signal amplification block.

3. The amplifier of claim 1, wherein the feed-forward offset correction block further comprises a second feed-forward amplification circuit configured to amplify the notched signal to generate the input offset correction signal.

4. The amplifier of claim 1, wherein the feed-forward offset correction block is configured to substantially control the gain versus frequency response of the signal amplification block at the chopping frequency.

5. The amplifier of claim 1, wherein the signal amplification block comprises:
   an input chopping circuit configured to chop the differential input voltage signal at the chopping frequency to generate a chopped input signal;
   a first amplification circuit configured to combine the chopped input signal and the input offset correction signal to generate a combined signal; and
   an output chopping circuit configured to chop the combined signal to generate a chopped combined signal.

6. The amplifier of claim 5, further comprising a pattern generator configured to generate a serial bit stream and a mixer configured to multiply the serial bit stream by a fixed-frequency clock signal to generate a chopping clock signal, wherein the input chopping circuit, the output chopping circuit, and the feed-forward chopping circuit are configured to receive the chopping clock signal for timing of signal chopping.

7. The amplifier of claim 5, further comprising a second amplification circuit configured to amplify the chopped combined signal to generate the output signal.

8. The amplifier of claim 7, wherein the chopped combined signal is a single-ended signal.

9. The amplifier of claim 7, further comprising a feedback offset correction block configured to amplify the chopped combined signal to generate a feedback signal and to provide the feedback signal to the feed-forward chopping circuit to reduce gain peaking of the amplifier at the chopping frequency.

10. The amplifier of claim 7, wherein the chopped combined signal is a differential signal.

11. The amplifier of claim 1, wherein the output signal comprises a single-ended output voltage signal.

12. The amplifier of claim 1, wherein a gain of the feed-forward offset correction block at the chopping frequency is selected to be at least 40 dB greater that a gain of the signal amplification block at the chopping frequency.

13. The amplifier of claim 1, wherein the output signal comprises a differential output voltage signal.

14. The amplifier of claim 1, wherein the notch filter includes a stop band, wherein the notch filter is configured to attenuate output signal signals having a frequency within the stop band, and wherein the notch filter is further configured to pass signals having a frequency outside of the stop band without attenuation, wherein the chopping frequency is within the stop band.

15. A method of electronic amplification, the method comprising:
   amplifying a differential input voltage signal to generate a feed-forward signal;
   chopping the feed-forward signal at a chopping frequency to generate a chopped feed-forward signal;
   notch filtering the chopped feed-forward signal at the chopping frequency to generate a notched signal;
   generating an input offset correction signal based at least partly on the notched signal; and
   amplifying the differential input voltage signal using a signal amplification block to generate an output signal, wherein amplifying the differential input voltage signal to generate the output signal comprises chopping the input signal at the chopping frequency to generate a chopped input signal and combining the chopped input signal and the offset correction signal to reduce input offset error of the signal amplification block.

16. The method of claim 15, wherein generating the input offset correction signal comprises amplifying the notched signal to generate the input offset correctional signal.

17. The method of claim 15, further comprising randomizing the chopping frequency by multiplying a fixed-frequency clock signal and a serial bit stream.

18. The method of claim 15, wherein combining the chopped input signal and the offset correction signal comprises adding the chopped input signal and the input offset correction signal to generate a combined signal.

19. The method of claim 18, further comprising chopping the combined signal to generate a chopped combined signal and amplifying the chopped combined signal to generate an output signal.

20. The method of claim 19, further comprising generating a feedback signal based on the chopped combined signal and reducing gain peaking at the chopping frequency using the feedback signal.

21. The method of claim 15, wherein notch filtering the chopped feed-forward signal comprises attenuating frequency components of the chopped feed-forward signal that are within about 10 percent of the chopping frequency by at least about 40 dB.

22. The method of claim 15, wherein notch filtering the chopped feed forward signal comprises attenuating signals having a frequency within a stop band of the notch filter, and substantially passing signals having a frequency outside of the stop band without attenuation, wherein the chopping frequency is within the stop band.

\* \* \* \* \*

UNITED STATES PATENT AND TRADEMARK OFFICE
CERTIFICATE OF CORRECTION

| | | |
|---|---|---|
| PATENT NO. | : 8,786,363 B2 | |
| APPLICATION NO. | : 13/495929 | |
| DATED | : July 22, 2014 | |
| INVENTOR(S) | : Fazil Ahmad | |

It is certified that error appears in the above-identified patent and that said Letters Patent is hereby corrected as shown below:

In the Claims

In column 16 at line 48, in Claim 14, change "signal signals" to --signals--.

Signed and Sealed this
Third Day of March, 2015

Michelle K. Lee
*Deputy Director of the United States Patent and Trademark Office*